United States Patent
Moon

(10) Patent No.: US 7,672,103 B2
(45) Date of Patent: Mar. 2, 2010

(54) CIRCUIT HAVING LOW OPERATING VOLTAGE FOR PROTECTING SEMICONDUCTOR DEVICE FROM ELECTROSTATIC DISCHARGE

(75) Inventor: Jung Eon Moon, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 169 days.

(21) Appl. No.: 12/048,406

(22) Filed: Mar. 14, 2008

(65) Prior Publication Data

US 2009/0201616 A1 Aug. 13, 2009

(30) Foreign Application Priority Data

Mar. 14, 2007 (KR) .................. 10-2007-0025187

(51) Int. Cl.
*H02H 9/00* (2006.01)
*H02H 3/20* (2006.01)
*H02H 9/04* (2006.01)
*H02H 3/22* (2006.01)
*H02H 1/00* (2006.01)
*H02H 1/04* (2006.01)
*H02H 9/06* (2006.01)
*H01C 7/12* (2006.01)

(52) U.S. Cl. .................. 361/56; 361/91.1; 361/111; 361/118

(58) Field of Classification Search .................. None
See application file for complete search history.

(56) References Cited

U.S. PATENT DOCUMENTS

| 6,690,561 | B2 * | 2/2004 | Hung et al. | 361/111 |
| 6,861,680 | B2 * | 3/2005 | Ker et al. | 257/199 |
| 7,312,966 | B2 * | 12/2007 | Lee | 361/56 |
| 2007/0242400 | A1 * | 10/2007 | Choi | 361/56 |

* cited by examiner

*Primary Examiner*—Albert W Paladini
*Assistant Examiner*—Dharti H Patel
(74) *Attorney, Agent, or Firm*—Ladas & Parry LLP

(57) ABSTRACT

A circuit for protecting a semiconductor device from electrostatic discharge by protecting an internal circuit from electrostatic current flowing into an input/output pad includes a first discharge unit that discharges the electrostatic current to a first power supply line or a second power supply line. A second discharge unit protects the internal circuit from electrostaticity flowing from the input/output pad or the second power supply line. A power clamp unit discharges the electrostatic current, which is discharged to the first power supply line or the second power supply line by the first discharge unit, to the opposite power supply line. A trigger unit drives the first discharge unit and the power clamp unit with first and second detection voltages generated in response to a voltage drop of the discharged electrostatic current.

11 Claims, 3 Drawing Sheets

CIRCUIT HAVING LOW OPERATING VOLTAGE FOR PROTECTING SEMICONDUCTOR DEVICE FROM ELECTROSTATIC DISCHARGE

CROSS-REFERENCE TO RELATED APPLICATIONS

The present application claims priority to Korean patent application number 10-2007-0025187 filed on Mar. 14, 2007, which is incorporated herein by reference in its entirety.

BACKGROUND OF THE INVENTION

The present invention relates to a circuit for protecting a semiconductor device from an electrostatic discharge, and more particularly to an electrostatic discharge protective circuit having a low operating voltage.

A typical semiconductor device includes an electrostatic discharge protective circuit for protecting an internal circuit from electrostaticity which flows from the input/output pad to the internal circuit.

The electrostatic discharge protective circuit prevents the electrostaticity from being discharged into the internal circuit when a pin of the integrated circuit contacts an electrified human-body or machine.

Meanwhile, semiconductor devices are being manufactured to achieve higher speeds and are becoming highly integrated; and thus the gate of the semiconductor device gradually thins. Therefore, defects in the semiconductor device occur when convention electrostatic discharge protective circuits allow electrostaticity to flow into the internal circuit.

This can be observed in a conventional electrostatic discharge protective circuit such as the electrostatic discharge protective circuit illustrated in FIG. 1. In the conventional electrostatic discharge protective circuit, the internal circuit and the gate oxide film of the electrostatic discharge protective device may be destroyed before the electrostaticity is discharged due to the high voltage.

Referring to FIG. 1, when positive electrostaticity flows through a pad and is discharged to a VSS pad, a GGNMOS N10 performs a parasitic bipolar operation and a GPPMOS p10 performs a parasitic diode operation to apply the positive electrostaticity to a power supply line VCC, and the electrostacity is discharged to a ground line VSS through a GGNMOS N14.

When negative electrostatic flows through the pad and is discharged to a VCC pad, the GPPMOS P10 performs the parasitic bipolar operation and the negative electrostaticity is then discharged to the power supply line VCC through both the GGNMOS N14, which performs a parasitic bipolar operation, and the GGNMOS N10, which performs a parasitic diode operation.

Additionally, a CDM transistor with a resistor R10 and a GGNMOS N12 is provided between input buffers 106 to protect the internal circuit.

Another conventional electrostatic discharge protective circuit is illustrated in FIG. 2. The conventional electrostatic discharge protective circuit of FIG. 2 discharges the positive electrostaticity flowing from the input/output pad to the VSS pad. At this time, a GPPMOS P20 acting as a parasitic diode discharges the positive electrostaticity to the power supply line. The positive electrostaticity flows from the input/output pad to the power supply line, and when the voltage dropped by the capacitor C20 and the resistor 22 is higher than the threshold voltage of a GCNMOS N24, the GCNMOS N24 turns on to discharge the positive electrostaticity to the ground pad V33. At this time, the operating voltage of GCNMOS N24 is about 6.2V.

Subsequently, the GGNMOS N20 is turned on to discharge the positive electrostaticity flowing into the input/output pad to the ground pad VSS through the ground line. At this time, the operating voltage of GGNMOS N20 is about 8.3V.

However, if electrostaticity having a high voltage continues to flow before discharge to the GCNMOS N24 is completed, a problem occurs, in that the gate oxide of the internal circuit can be destroyed before the GGNMOS N20 is operated.

On the other hand, in the case where negative electrostaticity flows in and is discharged to the VCC pad, the GPPMOS P20 performs the parasitic bipolar operation at about 8.1V, and thus the gate oxide of the internal circuit can be destroyed before the GPPMOS P20 is operated, as described above.

As mentioned above, since the conventional electrostatic discharge protective devices have a high operating voltage, the gate oxide films of the internal circuit, which have a low gate breakdown voltage, and the electrostatic discharge protective device can be destroyed when the conventional electrostatic discharge protective devices are utilized.

SUMMARY OF THE INVENTION

Accordingly, the present invention provides a circuit, which has a low operating voltage, for protecting a semiconductor device from electrostatic discharge.

The present invention improves the operation speed of the circuit for protecting a semiconductor device from electrostatic discharge In order to accomplish these, there is provided an electrostatic discharge protective circuit according to the present invention that protects an internal circuit from electrostatic current flowing into an input/output pad, comprising: a first discharge unit that discharges the electrostatic current to first power supply line or a second power supply line; a second discharge unit that protects the internal circuit from electrostaticity flowing from the input/output pad and the second power supply line; a power clamp unit that discharges the electrostatic current, which is discharged to the first power supply line or second power supply line, to the second power supply line or the first second power supply line opposed to the first power supply line or the second power supply line; and a trigger unit that drives the first discharge unit and the power clamp unit with first and second detection voltages detected in response to the voltage drop of the electrostatic current discharged to the first and second power supply lines.

Herein, the first discharge unit comprises a PMOS transistor being connected between the first power supply line and the input/output pad and having a gate applied with the first detection voltage, and a first NMOS transistor connected between the second power supply line and the input/output pad and having a gate applied with the second detection voltage.

Each of the transistors may have a source connected to a bulk.

Additionally, the second discharge unit comprises a resistor being connected between the input/output pad and the internal circuit, and a GGNMOS transistor having one terminal connected to the resistor and the internal circuit and another terminal connected to the second power supply line.

Meanwhile, the power clamp unit comprises a second NMOS transistor having a source and a bulk connected to the first power supply line or the second power supply line and having a gate receiving the second detection voltage.

The second NMOS transistor may have a source connected to the bulk.

Additionally, the trigger unit includes a first resistor connected between the first power supply line and the first discharge unit to generate the first detection voltage, a second resistor connected between the second power supply line and the first discharge unit to generate the second detection voltage, and a diode chain connected between the first and second resistors.

The diode chain includes a plurality of diodes serially connected to each other.

Additionally, the diode chain is controlled so as to be driven at voltage higher than normal operating voltage of the internal circuit Meanwhile, the first power supply line is a power supply voltage line, and the second power supply line is a ground voltage line.

DESCRIPTION OF SPECIFIC EMBODIMENTS

Hereinafter, preferred embodiment of the electrostatic discharge protective circuit according to the present invention will be described in detail with reference to the accompanying drawings.

Figure 3:
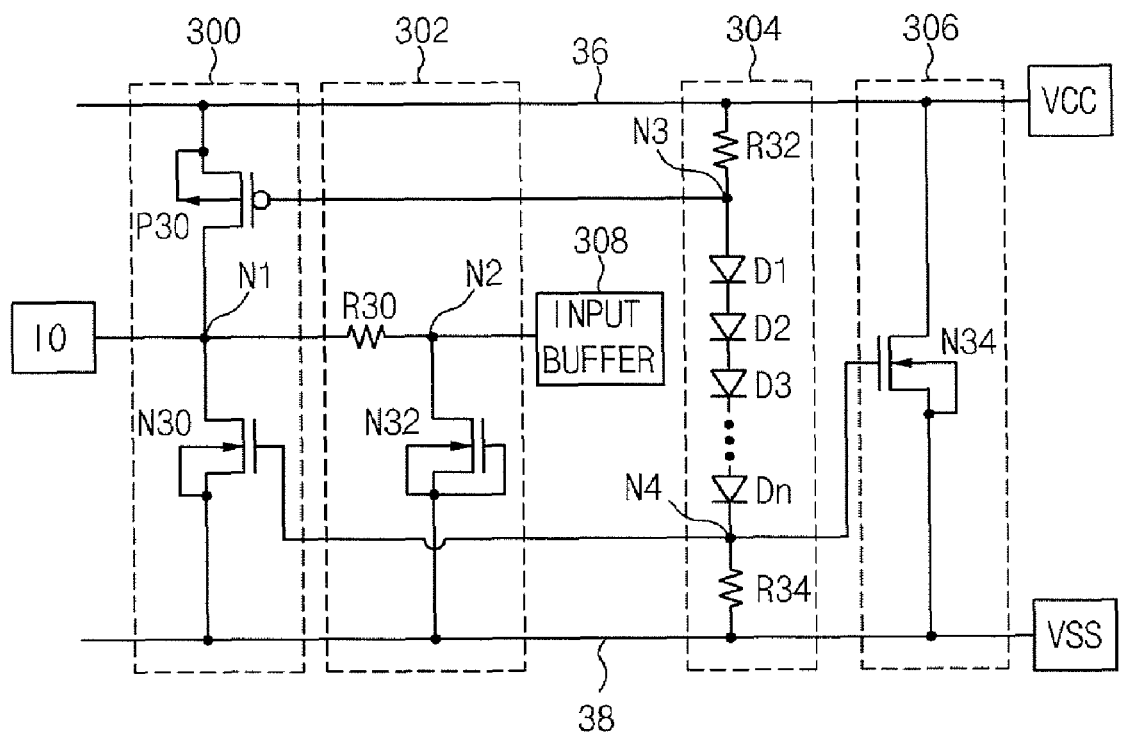
FIG. 3 shows an electrostatic discharge protective circuit according to an embodiment of the present invention.

Referring to FIG. 3, an electrostatic discharge protective circuit according to an embodiment of the present invention includes: a power supply line 36, a first discharge unit 300, and a second discharge unit 302 that discharge electrostaticity; and a trigger unit 304 and a power clamp unit 306.

The first discharge unit 300 includes a serially connected PMOS transistor P30 and NMOS transistor N30, which are selectively operated according to a voltage applied to the PMOS transistor P30 and NMOS transistor N30 from an input/output pad I0. Each transistor is connected to a source and a bulk so that it can be operated as a parasitic diode and a MOS transistor according to the applied electrostatic characteristics.

The second discharge unit 302 is includes a resistor R30 and a GGNMOS N32 for preventing electrostaticity from being discharged to the internal circuit.

The power clamp unit 306 includes an NMOS transistor N34 connected between the power supply line 36 and the ground line 38 to discharge the electrostaticity flowing from the power supply line 36 or the ground line 36.

The trigger unit 304 includes a diode chain (i.e., diodes D1, D2, D3, . . . Dn) connected between resistors R32 and R34, which are connected in series between the power supply line 36 and the ground line 38.

The number of the diodes D1, D2, D3, . . . Dn in the diode chain can be controlled to be operated at a normal or higher operating voltage of the internal circuit 308.

The diodes D1, D2, D3, . . . Dn in the diode chain can be connected to each other in series in such a manner that the cathode of each of the diodes D1, D2, D3, . . . Dn is directed to the resistor R34 and the anode of each of the diodes D1, D2, D3, . . . Dn is directed to a resister R32.

The operation of the electrostatic discharge protective circuit according to the present invention will now be described with reference to FIG. 3.

When positive electrostaticity flows through the input/output pad, it is discharged to the VSS pad. The first discharge unit 300 discharges the positive electrostaticity to the power supply line 36 by the PMOS transistor P30. The PMOS transistor P30 performs a diode operation moving charges along paths of a drain and a well by the electrostaticity having a momentarily high voltage. The electrostaticity discharged to the power supply line 36 can be discharged to a ground pad VSS through the trigger unit 304.

The electrostaticity discharged through the resistor R32 and the diodes D1, D2, D3, . . . , Dn in the trigger unit 304 generates a voltage drop at node N4 by the resistor R34. If the dropped voltage reaches the threshold voltage of the NMOS transistor N30, a channel is formed in the NMOS transistor N30, and the positive electrostaticiy is discharged to the ground pad VSS through the channel of the NMOS transistor N30.

Thereafter, the voltage dropped at the node N4 according to the increase of current by the electrostatic discharge is applied to the gate of the NMOS transistor N34 raising the gate voltage of the NMOS transistor N34.

If the gate voltage of such a NMOS transistor N34 is higher than the threshold voltage of NMOS transistor N34, the NMOS transistor N34 forms a channel and the electrostaticity remaining in the power supply line 36 is discharged to the ground pad VSS through the ground line 38.

On the other hand, when the negative electrostaticity flows through the input/output pad, it is discharged to the VCC pad. The NMOS transistor N30 of the first discharge unit 300 operates as a parasitic diode to discharge the negative electrostaticity to the ground line 38.

Thereafter, the trigger unit 304 generates a voltage drop at node N3 by the electrostaticity discharged through the resistor R34 and the diodes D1, D2, D3, . . . , Dn. Thus the dropped voltage at the node N3 is applied to the gate of the PMOS transistor P30, and if the dropped voltage reaches the threshold voltage of the PMOS transistor P30, a channel is formed in the PMOS transistor P30, and the negative electrostaticiy is discharged to the power supply pad VCC through the channel.

Thereafter, when the voltage of the node N4 is raised by the NMOS transistor N30 and the resistor R34 according to the increase of current by the electrostatic discharge and is applied to the gate of the NMOS transistor N34, when the voltage of the gate of the NMOS transistor reaches the threshold voltage of the NMOS transistor N34, a channel is formed in the NMOS transistor N34 to discharge the negative electrostatic current to the power supply pad VCC through the channel.

Figure 1:
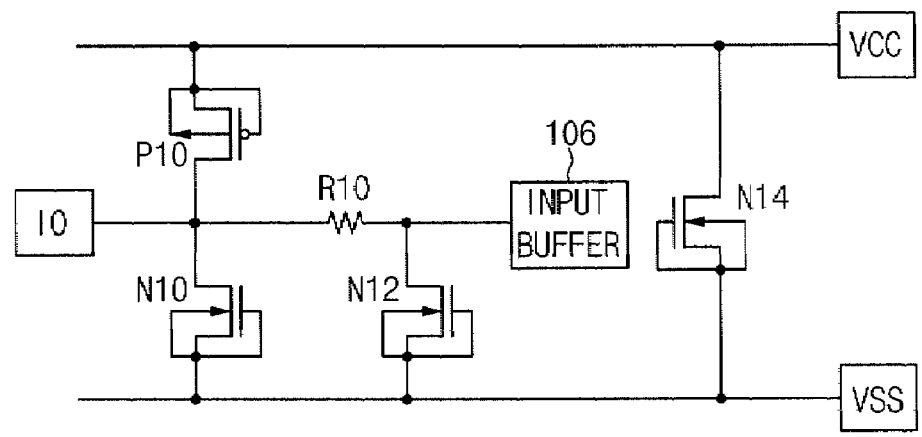
FIG. 1 illustrates a conventional electrostatic discharge protective circuit.
Figure 2:
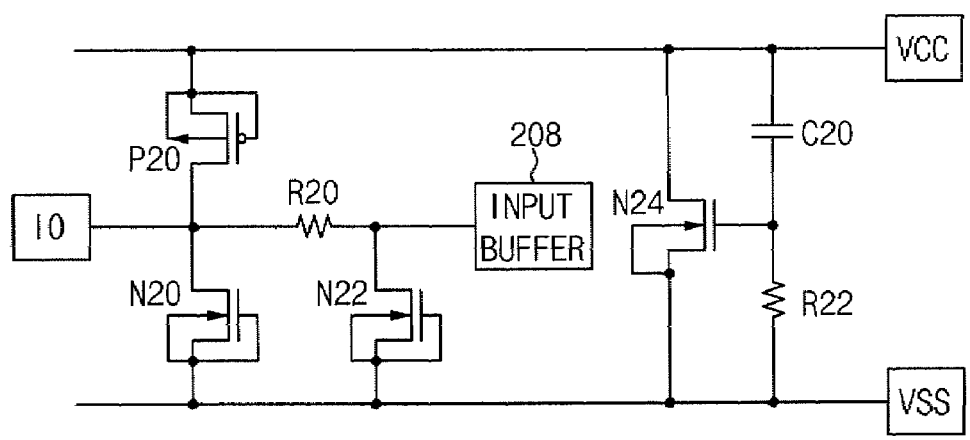
FIG. 2 illustrate another conventional electrostatic discharge protective circuit.
Figure 4A:
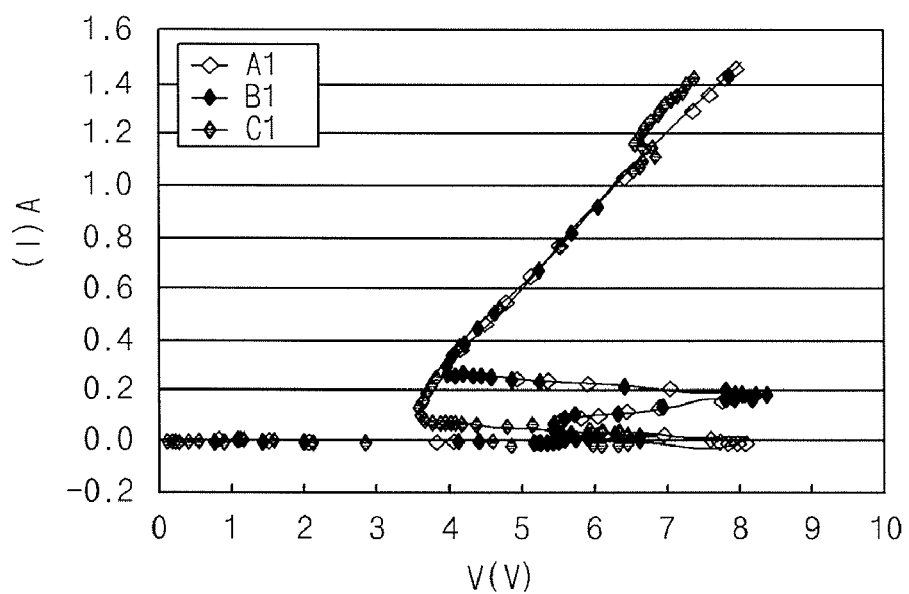
FIG. 4a is an operation waveform diagram comparing the discharge of positive electrostaticity of conventional circuit to an electrostatic discharge protective circuit according to an embodiment of the present invention.

With referencing to FIG. 4a, the operation waveform view A1 of the electrostatic discharge protective circuit of FIG. 1 can be reviewed. When the positive electrostaticity flows the operating voltage of the GGNMOS transistor N10 of FIG. 1 is about 8.1V, and the operating voltage of the GGNMOS transistor N14 of FIG. 1 is about 8.3V. Also, when reviewing the operation waveform view B1 of the electrostatic discharge protective circuit of FIG. 2, the operating voltage of the GCN- MOS transistor N24 of FIG. 2 is about 6.2V, and the operating voltage of the GCNMOS transistor N20 of FIG. 2 is about 8.3V.

On the other hand, when reviewing the operation waveform view C1 of the electrostatic discharge protective circuit according to the present invention, the NMOS transistor N30 of FIG. 3 and the NMOS transistor N34 of FIG. 3 each perform a MOS operation through a channel, so that their operating voltages appear at low operation voltages of about 6.7V and 6.9V, respectively.

Figure 4B:
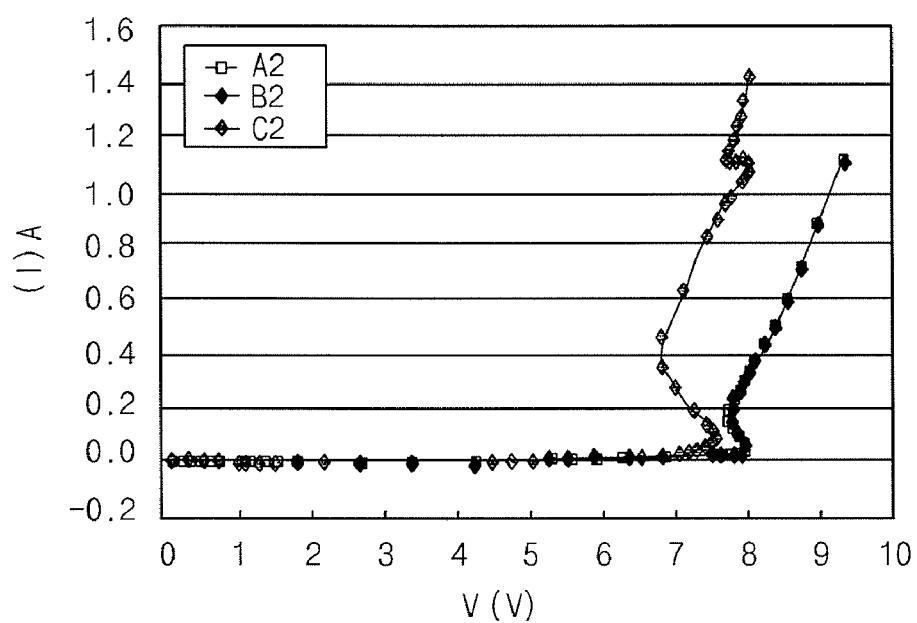
FIG. 4b is an operation waveform diagram comparing the discharge of negative electrostaticity of conventional circuits to an electrostatic discharge protective circuit according to an embodiment of the present invention.

With reference to FIG. 4b, the operation waveform view A2 of the electrostatic discharge protective circuit of FIG. 1 can be reviewed. When the negative electrostaticity flows the operating voltage of GPPMOS P10 of FIG. 1 is about 8.1V. Also, when reviewing the operation waveform view B2 of the electrostatic discharge protective circuit of FIG. 2, the operating voltage of GPPMOS (P20 of FIG. 2) is a high operating voltage of about 8.1V.

On the other hand, when reviewing the operation waveform view C2 of the electrostatic discharge protective circuit according to the present invention, the PMOS transistor (P30 of FIG. 3) and the NMOS transistor (N34 of FIG. 3) each perform a MOS operation through a channel, so that their operating voltages appear at low operation voltages of about 7.5V and 7.79V, respectively.

As described above, the electrostatic discharge protective circuit according to the present invention includes a trigger unit including a diode chain in order to lower the operating voltage thereof.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A circuit for protecting an internal circuit from electrostatic current flowing into an input/output pad, the circuit comprising:
    a first discharge unit discharging the electrostatic current to a first power supply line or a second power supply line;
    a second discharge unit protecting the internal circuit from electrostaticity from either the input/output pad or the second power supply line;
    a power clamp unit transferring the electrostatic current of the first power supply line to the second power supply line or transferring the electrostatic current of the second power supply line to the first power supply line; and
    a trigger unit that drives the first discharge unit and the power clamp unit with first and second detection voltages generated by a voltage drop of the electrostatic current discharged to the first and second power supply lines respectively.

2. The circuit of claim 1, wherein the first discharge unit comprises:
    a PMOS transistor connected between the first power supply line and the input/output pad, wherein the gate of the PMOS transistor receives the first detection voltage; and
    a first NMOS transistor connected between the second power supply line and the input/output pad, wherein the gate of first NMOS transistor receives the second detection voltage.

3. The circuit of claim 2, wherein each of the PMOS transistor and the first NMOS transistor has a source connected to a bulk.

4. The circuit of claim 1, wherein the second discharge unit comprises:
    a resistor connected between the input/output pad and the internal circuit; and
    a GGNMOS transistor having a first terminal connected to the resistor and the internal circuit and a second terminal connected to the second power supply line.

5. The circuit of claim 1, wherein the power clamp unit comprises:
    a second NMOS transistor having a source and a bulk connected to the first power supply line or the second power supply line, wherein the gate of the second NMOS transistor receives the second detection voltage.

6. The circuit of claim 5, wherein the second NMOS transistor has the source connected to the bulk.

7. The circuit of claim 1, wherein the trigger unit comprises:
    a first resistor connected between the first power supply line and the first discharge unit to generate the first detection voltage;
    a second resistor connected between the second power supply line and the first discharge unit to generate the second detection voltage; and
    a diode chain connected between the first and the second resistors.

8. The circuit of claim 7, wherein the diode chain comprises a plurality of serially connected diodes.

9. The circuit of claim 8, wherein the diode chain is controlled so as to be driven at voltage higher than a normal operating voltage of the internal circuit.

10. The circuit of claim 1, wherein the first power supply line is a power supply voltage line.

11. The circuit of claim 1, wherein the second power supply line is a ground voltage line.

* * * * *